United States Patent
Skoglund et al.

(10) Patent No.: US 8,831,249 B1
(45) Date of Patent: *Sep. 9, 2014

(54) CLIPPING PROTECTION IN FIXED-WIDTH AUDIO MIXING

(75) Inventors: Jan Skoglund, San Francisco, CA (US); Andrew John MacDonald, San Francisco, CA (US)

(73) Assignee: Google Inc., Mountain View, CA (US)

( * ) Notice: Subject to any disclaimer, the term of this patent is extended or adjusted under 35 U.S.C. 154(b) by 430 days.

This patent is subject to a terminal disclaimer.

(21) Appl. No.: 13/271,123

(22) Filed: Oct. 11, 2011

(51) Int. Cl.
*H04B 1/00* (2006.01)
*H03G 3/00* (2006.01)

(52) U.S. Cl.
USPC .......................................... 381/119; 381/104

(58) Field of Classification Search
CPC ......... H03G 7/00; H03G 7/002; H03G 7/007; H04R 3/005
USPC ................ 381/119, 104; 700/94; 379/202.01; 455/177.1, 199.1, 200.1, 232.1
See application file for complete search history.

(56) References Cited

U.S. PATENT DOCUMENTS

| | | | |
|---|---|---|---|
| 5,402,500 A | 3/1995 | Sims, Jr. | |
| 5,706,352 A | 1/1998 | Engebretson et al. | |
| 6,301,366 B1 | 10/2001 | Malcolm, Jr. et al. | |
| 6,952,621 B1 | 10/2005 | Malcolm, Jr. et al. | |
| 7,006,616 B1 | 2/2006 | Christofferson et al. | |
| 7,302,303 B2 * | 11/2007 | Reefman et al. | 700/94 |
| 7,729,673 B2 * | 6/2010 | Romesburg et al. | 455/199.1 |

* cited by examiner

*Primary Examiner* — Vivian Chin
*Assistant Examiner* — Ammar Hamid
(74) *Attorney, Agent, or Firm* — Birch, Stewart, Kolasch & Birch, LLP

(57) ABSTRACT

A mixing system provides both clipping protection and signal level conservation while the system operates in the original width type. The mixing system includes a first input multiplier multiplying a first digital input signal by a first gain value to provide a first scaled signal, a second input multiplier multiplying a second digital input signal by the first gain value to provide a second scaled signal, a combiner combining the first scaled signal and the second scaled signal to provide a combined signal, a soft limiter soft limiting the combined signal by reducing some of the amplitudes of the combined signal to provide a soft limited signal, and an output multiplier multiplying the soft limited signal by a second gain value to provide a mixed output signal, wherein the first gain value is a value that is equal to an inverse value of the second gain value.

18 Claims, 10 Drawing Sheets

CLIPPING PROTECTION IN FIXED-WIDTH AUDIO MIXING

FIELD OF THE INVENTION

The present disclosure generally relates to a system, method, and computer-readable storage medium for providing both clipping protection and signal level conservation while mixing audio signals.

BACKGROUND

In teleconferencing, particularly in voice conferencing, the participating audio streams must be mixed at some point prior to playing out (reproducing) the audio streams at a client node (e.g., an end user's PC or a mobile device).

In conventional systems, the digital audio samples are represented by a certain fixed-width (fixed-length) data type, and all processing will tend to be based around this type. For example, it is common practice to represent audio samples with 16-bit signed integers.

However, in conventional systems, problems arise from using this type fixed-width representation when signals are combined. More specifically, the combined signal, which is a sum of the individual signals, may be larger than is possible to represent in the fixed-width type. This is because, during the actual summation of the individual signals, it is typical to temporarily upcast to a sufficiently wide type to avoid integer overflow.

Further, in order to return (or to downcast) back to the original width, the signal is truncated or "clipped" to the available range (usually denoted by [intmin, intmax], intmin and intmax being the minimum and maximum integer representation in the fixed width domain). In audio processing, this clipping results in audible and potentially severe distortion. Thus, the combined signal must be reduced or softly limited in some way to avoid the harsh distortion of clipping.

SUMMARY

This Summary introduces a selection of concepts in a simplified form in order to provide a basic understanding of some aspects of the present disclosure. This Summary is not an extensive overview of the disclosure, and is not intended to identify key or critical elements of the disclosure or to delineate the scope of the disclosure. This Summary merely presents some of the concepts of the disclosure as a prelude to the Detailed Description provided below.

Aspects of the present invention offer both clipping protection and signal level conservation while operating in the original width type (besides the usual temporary upcasts to avoid overflow). Therefore, there is no need for processing to occur (in regard to any of the disclosed multiplication operations) when only a single stream is to be mixed (e.g., when receiving a single audio stream). In other words, there is no need for applying a gain value to an input multiplier and there is no need for applying a gain value to an output multiplier when only a single audio stream is to be mixed.

However, when multiple (audio) streams are received, the mixing system combines together all of the received audio streams. Therefore, embodiments of the present invention provide a method and system for ensuring (with a high probability) that the combined signal is not clipped. In addition, aspects of the present invention allow for the levels of the original (received) signals to be maintained (e.g., for play out) after performing the combining process on the original received signals and producing a mixed signal.

In the proposed approach of this application, as multiple streams are added to the mix, processing can be started without an audible change in level. For example, the steps are demonstrated in the block diagrams (e.g., see FIGS. 1-6). Each received input signal is scaled by a constant gain value (for example, a gain value of "1/a"). In the mixing system of this application, the constant factor is chosen to balance clipping protection and loss of precision. Because the signals are represented as integers, any limiting (e.g., attenuation) can result in a loss of precision. It should be noted that a higher limiting factor results in more protection and less precision. Therefore, in the mixing system, the value of "a" may be preset (and/or fixed) to a=2 in order to balance the clipping protection and the loss of precision.

In aspects of the proposed approach, each of the scaled received input signals are combined in a combiner. After combining, the combined received signal is provided to a limiter to perform "soft limiting" on the combined received signal in order to provide a combined limited signal.

In digital signal processing, a soft limiter can soft limit the signal when the signal is outside a certain range (e.g., surpasses a threshold). The soft limiter is configured to (dynamically or statistically) set a limiting factor or ceiling level to a value that prevents any of the individual input signals from exceeding a determined or predefined magnitude limit(s). In other words, the soft limiter can determine the amplitude or magnitude level(s) of the incoming signal(s), and, based on the determined level(s), soft limit or reduce the amplitude or magnitude of an incoming signal to a certain level (e.g., a limiting level or a limiting factor), where the level may be a predetermined level or a level which is previously set or fixed.

In contrast to soft limiting, a hard limiter restricts all values more than the limiting level and assigns them (e.g., the restricted values) the value of the limiting level (e.g., clips or limits everything above the limiting level to the limiting level). Therefore, the difference is that a soft limiter that performs soft limiting attenuates signal values not only above the limiting level; but also below the limiting level, e.g., the soft limiting decreases the gain more and more as the values approach the limit. In other words, soft limiting lowers or reduces each peak of a signal that is above the limiting level to provide a rounded peak that no longer surpasses the limiting level; thus, eliminating the need for clipping the signal values above the limiting level.

The limiting factor for the soft limiter is chosen to make the probability of clipping low. Furthermore, due to the uncorrelated nature of conference audio signals, it is likely that under the approach described herein, much of the combined signal lies below the level of intmax/a. This motivates processing the signal with a soft limiter set to intmax/a.

In addition, the limit (maximum magnitude limit or limits) of the soft limiter may be set slightly lower in order to provide some room for the soft limiter to occasionally exceed the limit. For example, with gain of a=2, the limiter may adopt this approach by setting the soft limiter to −7 dbFS (decibels relative to full scale) (where 20*log 10(1/2)≈6 dbFS). Therefore, the combined received signal is safely limited, where the level is then restored to the mixed signal with the constant gain value (e.g., a constant gain value of "a").

Thus, according to a first aspect of the present invention, there is provided an apparatus that comprises a first input multiplier multiplying a first digital input signal by a first gain value to provide a first scaled signal; a second input multiplier multiplying a second digital input signal by the first gain value to provide a second scaled signal; a combiner combining the first scaled signal and the second scaled signal to provide a combined signal; a soft limiter soft limiting the combined signal by reducing some of the amplitudes of the combined signal to provide a soft limited signal; and an output multiplier multiplying the soft limited signal by a second gain value to provide a mixed output signal, wherein the first gain value is a value that is equal to an inverse value of the second gain value.

According to an embodiment of the present invention, the first digital input signal is of a fixed width data type having a fixed length of x bit integers, the second digital input signal is of the fixed width data type having the fixed length of x bit integers, the mixed output signal is of the fixed width data type having the fixed length of x bit integers, the combiner is combining the first scaled signal and the second scaled signal at a fixed length of y bit integers, the soft limiter is soft limiting the combined signal at the fixed length of x bit integers, and the value of y is greater than the value of x.

According to another embodiment of the present invention, the first gain value or the second gain value is determined based on a probability of clipping in the apparatus.

According to a further embodiment of the present invention, the apparatus is a mixing system.

According to an additional embodiment of the present invention, the apparatus may further comprise an input multiplier unit comprising a plurality of input multipliers, the plurality of input multipliers including at least the first input multiplier and the second input multiplier; and a controller determining the number of input signals provided to the plurality of input multipliers, wherein the controller determines the first gain value or the second gain value based on the number of input signals provided to the plurality of input multipliers.

According to another embodiment of the present invention, the apparatus may also comprise a third input multiplier multiplying a third digital input signal by the first gain value to provide a third scaled signal, wherein the combiner combines the first scaled signal, the second scaled signal, and the third scaled signal to generate the combined signal.

According to a further embodiment of the present invention, the soft limiter reduces some of the amplitudes of the combined signal based on a comparison to a threshold, wherein the threshold is determined based on either the first gain value or the second gain value.

According to an additional embodiment of the present invention, the soft limiter reduces some of the amplitudes of the combined signal based on a comparison to a threshold, wherein the threshold is determined based on a probability of clipping in the mixing system and either the first gain value or the second gain value.

According to another embodiment of the present invention, the second gain value is equal to 2.

According to a further embodiment of the present invention, the combiner is an adder that adds the first scaled signal and the second scaled signal to provide the combined signal.

According to an additional embodiment of the present invention, the apparatus may further comprise an output unit outputting the mixed output signal, wherein the output unit is an antenna or a cable.

According to a second aspect of the present invention, there is provided an mixing system that comprises a plurality of input multipliers respectively multiplying a plurality of digital input signals by a first gain value to respectively provide a plurality of scaled signals; a combiner combining the plurality of scaled signals to provide a combined signal; a soft limiter soft limiting the combined signal by reducing some of the amplitudes of the combined signal to provide a soft limited signal; and an output multiplier multiplying the soft limited signal by a second gain value to provide a mixed output signal, wherein the first gain value is a value that is equal to an inverse value of the second gain value.

According to an embodiment of the present invention, the first gain value or the second gain value is determined based on the number of said plurality of digital input signals multiplied by the first gain value.

According to another embodiment of the present invention, the first gain value or the second gain value is determined based on a probability of clipping in the mixing system.

According to a further embodiment of the present invention, the first gain value or the second gain value is determined based on the number of said plurality of digital input signals multiplied by the first gain value and a probability of clipping in the mixing system.

According to a third aspect of the present invention, there is provided a method comprising the steps of multiplying a first digital input signal by a first gain value to provide a first scaled signal; multiplying a second digital input signal by the first gain value to provide a second scaled signal; combining the first scaled signal and the second scaled signal to provide a combined signal; soft limiting the combined signal by reducing some of the amplitudes of the combined signal to provide a soft limited signal; and multiplying the soft limited signal by a second gain value to provide a mixed output signal, wherein the first gain value is a value that is equal to an inverse value of the second gain value.

Further scope of applicability of embodiments of the present invention will become apparent from the Detailed Description given below. However, it should be understood that the Detailed Description and specific examples, while indicating preferred embodiments of the invention, are given by way of illustration only, since various changes and modifications within the spirit and scope of the embodiments of the invention will become apparent to those skilled in the art from this Detailed Description.

BRIEF DESCRIPTION OF DRAWINGS

These and other objects, features and characteristics of the present disclosure will become more apparent to those skilled in the art from a study of the following Detailed Description in conjunction with the appended claims and drawings, all of which form a part of this specification. In the drawings:

Figure 1:
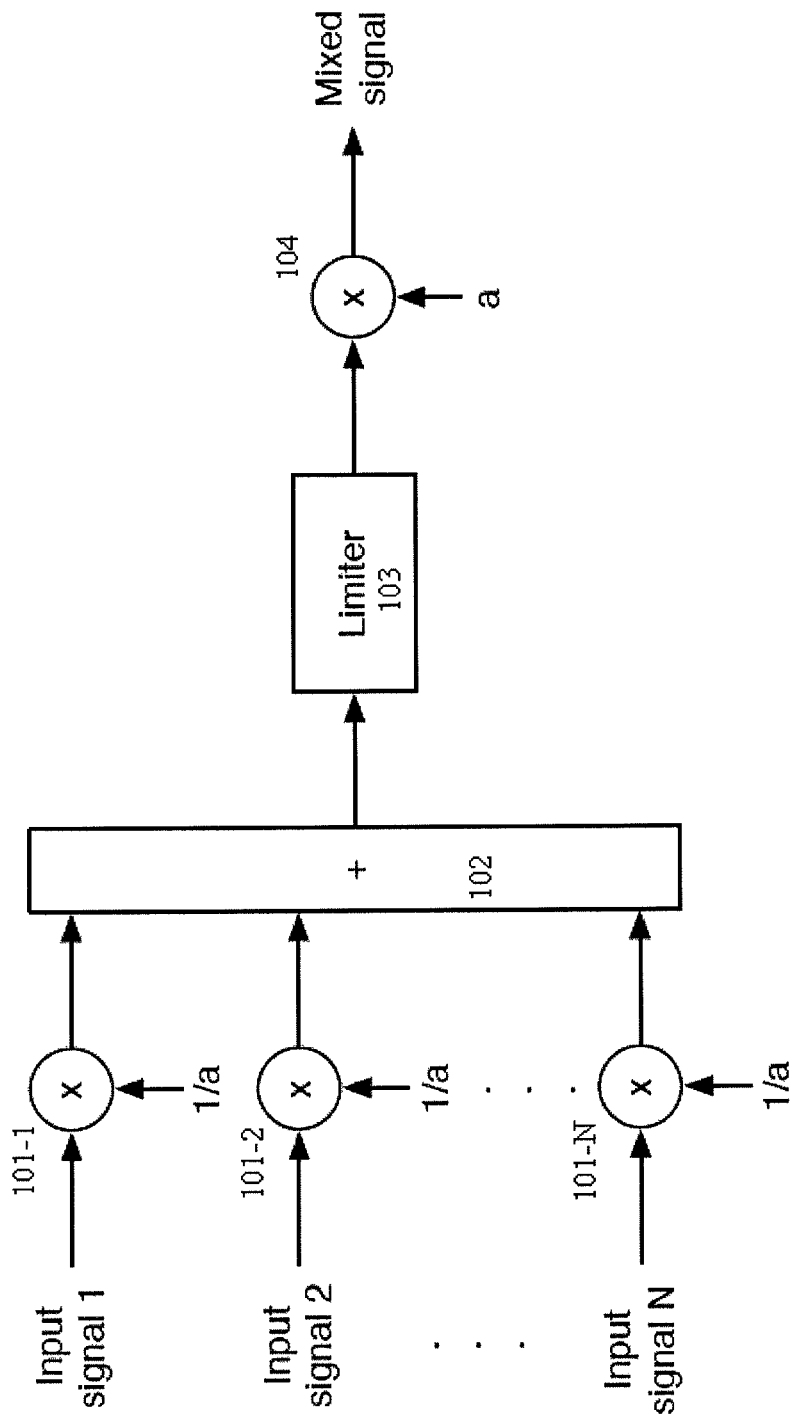
FIG. 1 is a circuit diagram of one aspect of a mixing system according to one or more embodiments described herein.

The headings provided herein are for convenience only and do not necessarily affect the scope or meaning of the claimed invention.

In the drawings, the same reference numerals and any acronyms identify elements or acts with the same or similar structure or functionality for ease of understanding and convenience. The drawings will be described in detail in the course of the following Detailed Description.

DETAILED DESCRIPTION

Various examples of the invention will now be described. The following description provides specific details for a thorough understanding and enabling description of these examples. One skilled in the relevant art will understand, however, that aspects of the invention may be practiced without many of these details. Likewise, one skilled in the relevant art will also understand that aspects of the invention can include many other obvious features not described in detail herein. Additionally, some well-known structures or functions may not be shown or described in detail below, so as to avoid unnecessarily obscuring the relevant description.

FIG. 1 is a circuit diagram of an example mixing system according to one or more embodiments of the invention. In FIG. 1 (and in most of FIGS. 2 through 6), the example mixing system should include an input unit(s) or receiving unit(s) (not shown), input multipliers 101-1, 101-2, ... 101-N, a gain providing unit(s) (not shown), a combiner 102, a limiter 103 (also referred to as a soft limiter), an output multiplier 104, and an output unit (not shown).

It should be noted that the mixing system as described in FIGS. 1 to 4 includes an input multiplying unit that comprises the multipliers 101-1, 101-2, ... 101-N. In other words, if the mixing system comprises only a single multiplier (e.g., multiplier 101-1), the input multiplying unit is the device comprising only the single multiplier 101-1. However, if the mixing system comprises only two multipliers (e.g., multipliers 101-1 and 101-2) or three multipliers (e.g., multipliers 101-1, 101-2, and 101-N), the input multiplying unit is the device comprising only the two multipliers or the three multipliers, respectively. Thus, if the mixing system comprises N multipliers (e.g., multipliers 101-1, 101-2, ... 101-N), the input multiplying unit is the device comprising the N multipliers.

Figure 3:
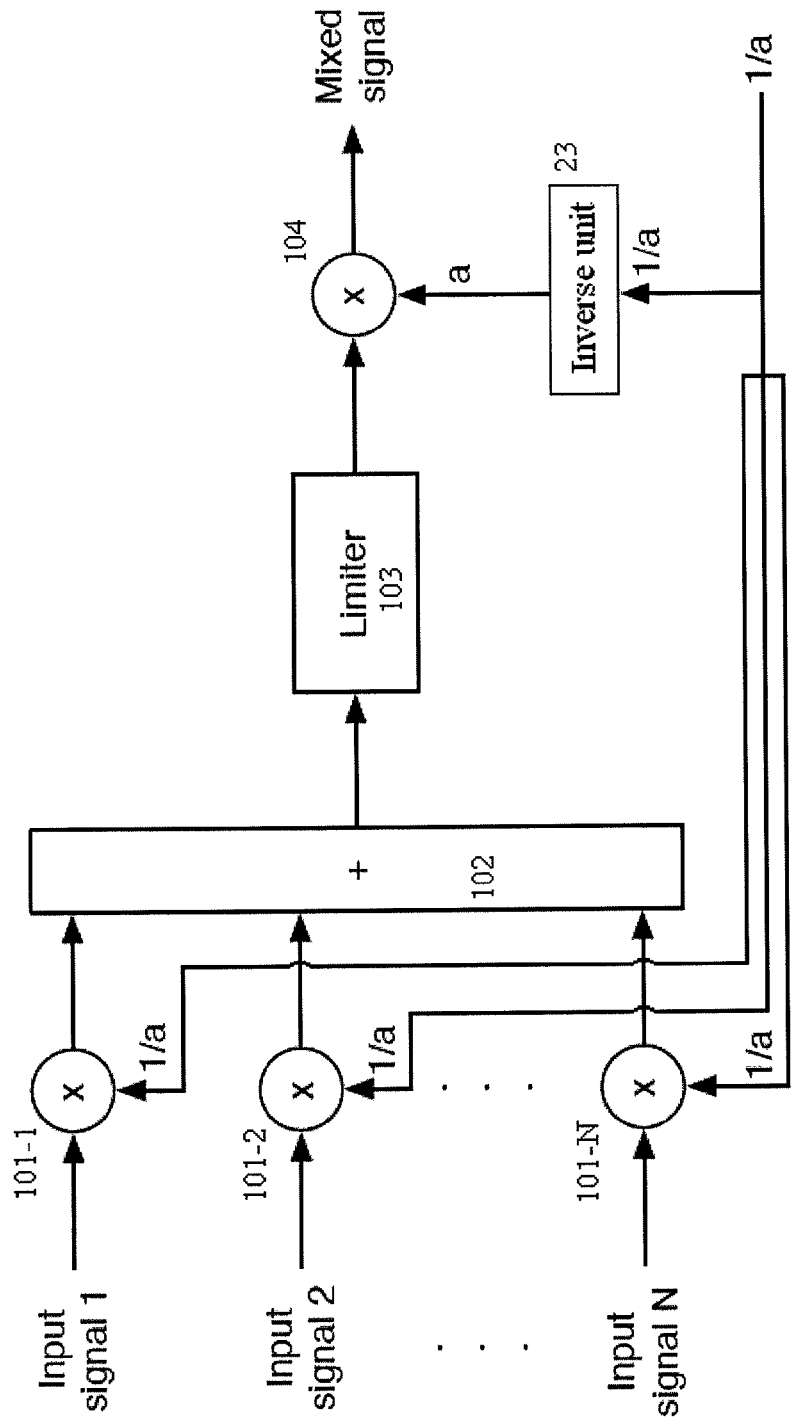
FIG. 3 is a circuit diagram of another aspect of a mixing system according to one or more embodiments described herein.
Figure 4:
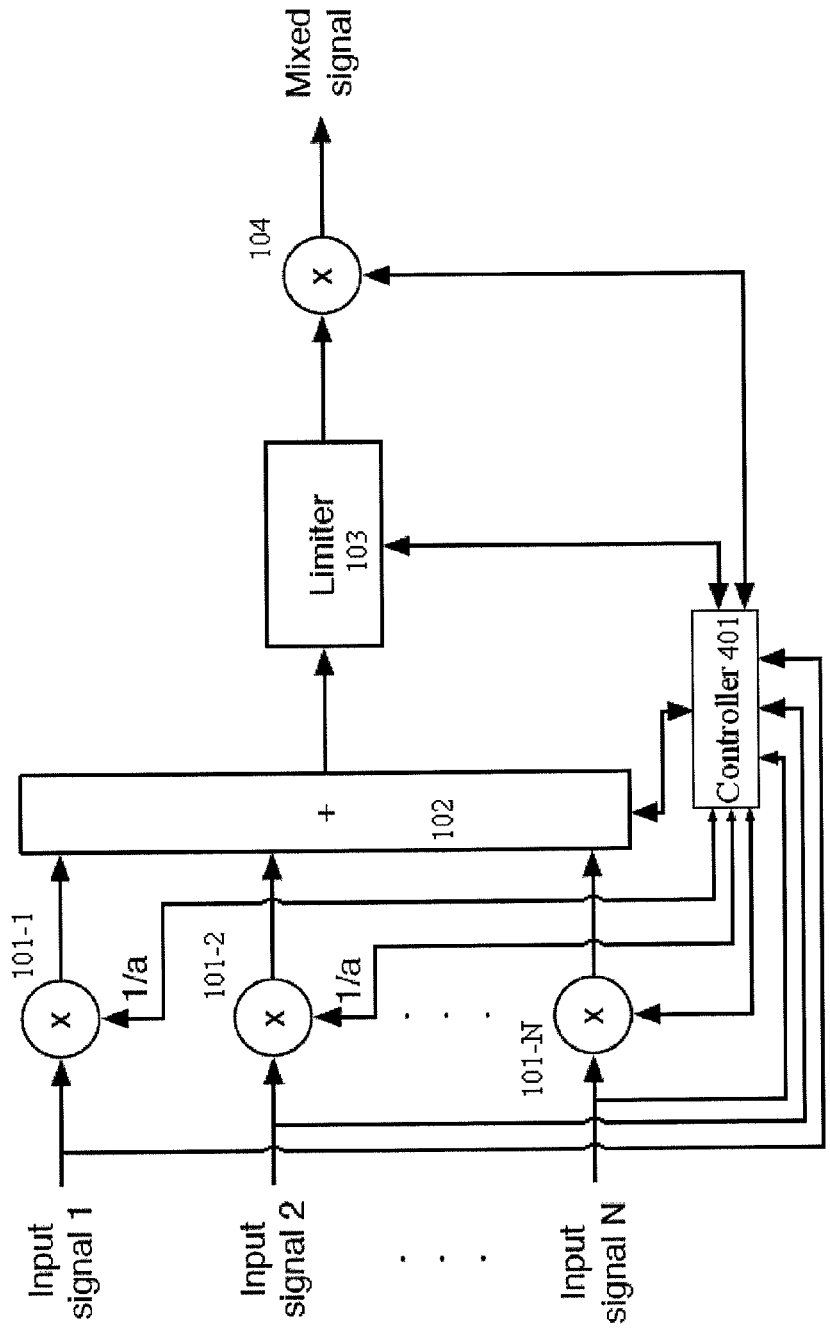
FIG. 4 is a circuit diagram of another aspect of a mixing system according to one or more embodiments described herein.
Figure 5:
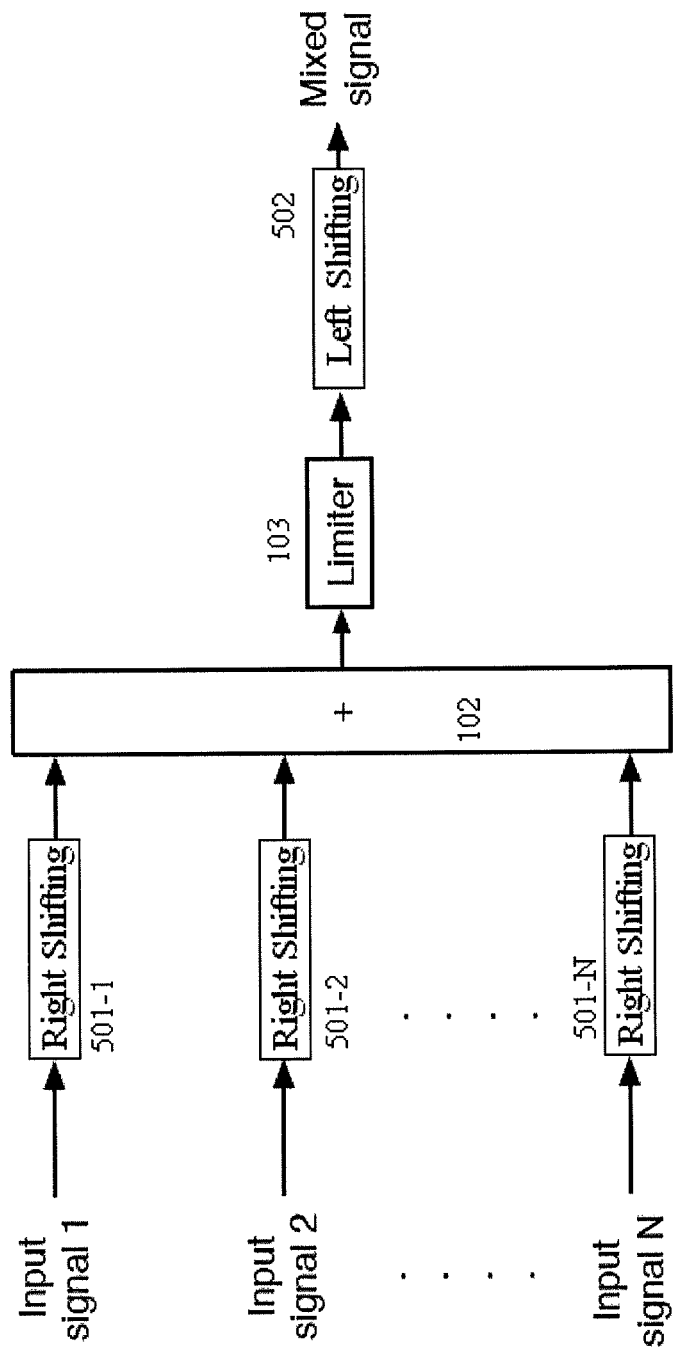
FIG. 5 is a circuit diagram of another aspect of a mixing system according to one or more embodiments described herein.
Figure 6:
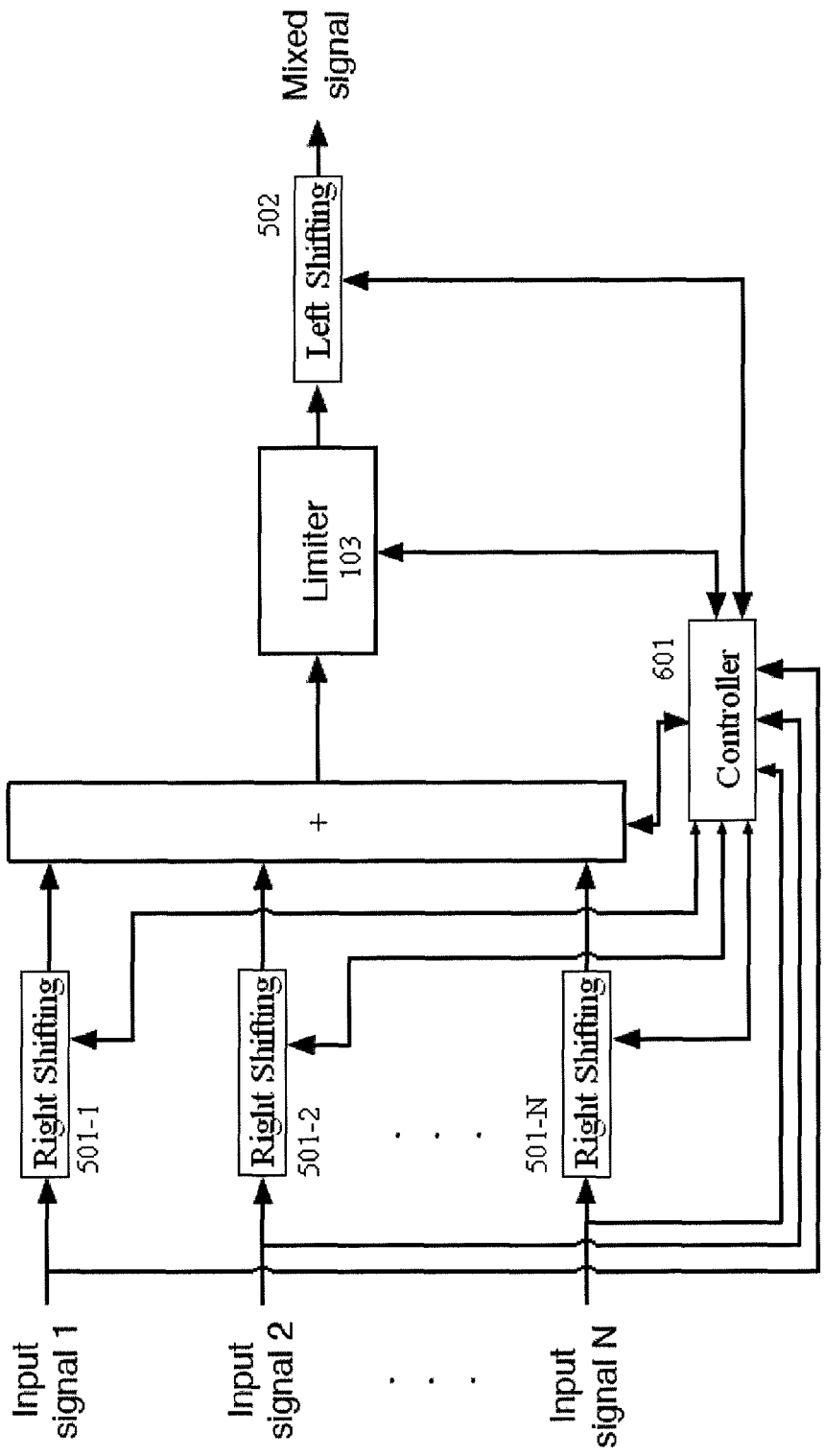
FIG. 6 is a circuit diagram of another aspect of a mixing system according to one or more embodiments described herein.

In FIGS. 1 through 6, an input unit(s) (not shown) may be found prior to the input multipliers (e.g., multipliers 101-1, 101-2, ... 101-N) of FIGS. 1 through 4 or prior to the right shifting units (e.g., right shifting units 501-1, 501-2, ... 501-N) of FIGS. 5 and 6 in order to receive the input signal(s) (input signals 1, 2, ... N). The mixing system may include a single input unit that can receive a plurality of input signals where the single input unit provides the plurality of input signals to each of the input multipliers (e.g., multipliers 101-1, 101-2, ... 101-N) of FIGS. 1 through 4 or to each of the right shifting units (e.g., right shifting units 501-1, 501-2, ... 501-N) of FIGS. 5 and 6, respectively. In some embodiments, the mixing system may instead include an input unit for each of the input multipliers (e.g., multipliers 101-1, 101-2, ... 101-N) of FIGS. 1 through 4 or for each of the right shifting units (e.g., right shifting units 501-1, 501-2, ... 501-N) of FIGS. 5 and 6. The input unit(s) is not limited to being a simple inputting device(s), for example, the input unit(s) may be a single antenna or a plurality of antennas (e.g., a receiver(s)) or a single cable or a plurality of cables.

Each input multiplier of FIGS. 1 through 4 can receive an input signal (e.g., via an input unit or input units). Each input signal can be, for example, an (analog) audio signal. Further, each input signal can be, for example, a digital input signal which represents an audio signal.

FIGS. 1 through 4 each illustrate an example mixing system that includes at least three input multipliers (e.g., input multipliers 101-1, 101-2, ... 101-N) and at least three input signals (e.g., input signal 1, input signal 2, and input signal N). However, the mixing systems shown are not limited to only three input multipliers and three input signals. For example, any of the mixing systems could also operate with only two input multipliers, four input multipliers, five input multipliers, six input multipliers, etc.

Each input multiplier of the example mixing systems shown in FIGS. 1 through 4 multiplies its received input signal by a gain value. For example, the gain value applied to input multipliers 101-1, 101-2, ... 101-N may be a gain value of "1/a", where "a" is a value greater than 1.

However, if the mixing system receives only one input signal (e.g., input signal 1), the mixing system would only need one input multiplier (e.g., input multiplier 101-1). In the case that the mixing system receives only one input signal, no gain should be applied to the input multiplier (e.g., input multiplier 101-1) or the gain value applied to the single input multiplier (e.g., input multiplier 101-1) would be a gain value equal to 1. In addition, if the mixing system receives only one input signal (e.g., input signal 1), the mixing system may be designed without the use of any input multipliers (or an output multiplier).

After each input multiplier multiplies its respective received input signal by a gain value, each input multiplier provides a scaled signal. Thus, a first input multiplier (e.g., input multiplier 101-1) multiplies a first input signal (e.g., input signal 1) by a first gain value (e.g., "1/a") to provide a first scaled signal while a second input multiplier (e.g., input multiplier 101-2) multiplies a second input signal (e.g., input signal 2) by the first gain value to provide a second scaled signal.

Each gain value provided to each input multiplier (e.g., input multipliers 101-1, 101-2, ... 101-N) may be provided by a single gain providing unit (not shown) or a plurality of gain providing units (not shown) where a gain providing unit is provided to correspond to each input multiplier. Further, the gain value provided to the output multiplier (e.g., the output multiplier 104) may be provided by another gain providing unit (not shown) different from the gain providing unit(s) of the input multipliers. However, the gain value provided to the output multiplier (e.g., the output multiplier 104) may be provided by the same single gain providing unit of the input multipliers.

In addition, the example mixing system shown in each of FIGS. 1 through 6 includes a combiner (e.g., combiner 102) that performs a combining operation on the inputted (scaled) signals (e.g., the first scaled signal and the second scaled signal). In at least some embodiments, the combiner inputs multiple (parallel) input signals and provides a single combined output signal. The combiner is not limited to being a combiner that performs a combining operation on the inputted signals. Instead, the combiner may be an adder that performs an adding operation on the inputted signals (also referred to as a summer that performs a summing operation on the inputted signals), a mixer that performs a mixing operation on the inputted signals, etc.

Thus, the combiner (e.g., combiner 102) combines the inputted received audio signals (e.g., the first scaled signal, the second scaled signal, ... the nth scaled signal) to provide a single (combined) signal. Hereinafter, the single (combined) signal outputted by the combiner 102 is referred to as a "combined signal." In addition, the process of combining the inputted received audio signals to provide a single combined signal may be referred to as "mixing."

Further, each of the example mixing system of FIGS. 1 through 6 includes a soft limiter (e.g., limiter 103) which is set to reduce the range of the inputted signal (e.g., the combined signal) by performing a soft limiting operation or attenuating operation on the combined signal. Soft limiter 103 provides soft limiting to prevent any input signal within the combined signal (e.g., outputted from the combiner 102) from exceeding defined or desired limits (e.g., to prevent saturation), while still preserving the gain and/or amplitude relationships among the individual input signals (e.g., input signal 1, input signal 2, . . . input signal N).

Therefore, after combining, the combined signal is provided to soft limiter 103 so that limiter 103 performs a "soft limiting" on the combined signal to provide a combined limited signal. In at least one embodiment, soft limiter 103 is configured to (e.g., dynamically or statistically) set a limiting factor or ceiling level to a value that prevents any of the individual input signals from exceeding a determined or predefined magnitude limit.

The limiting factor (or the ceiling level) for the soft limiter (e.g., limiter 103) is chosen to make the probability of clipping low. Furthermore, due to the uncorrelated nature of conference audio signals, it is likely that much of the combined (mixed) signal lies below the level of intmax/a. This motivates processing the signal with a soft limiter set to intmax/a.

In addition, in one of more embodiments, the limit (maximum magnitude limit or limits) of the soft limiter may be set slightly lower (e.g., a reduced maximum limit) in order to provide some room for the soft limiter to occasionally exceed the limit. For example, with a gain of a=2, the limiter may adopt this approach by setting the soft limiter to −7 dbFS (where 20*log 10(1/2)≈−6 dbFS). Therefore, the combined signal is safely limited, and it is safe to apply the constant gain value (e.g., the gain value of "a"), after the soft limiter 103, to the combined limited signal to restore it back to the original level.

The limiting factor (e.g., maximum magnitude limit) of the soft limiter 103 may be set slightly lower by first determining the value of "intmax/a," which is the maximum integer representation divided by the gain factor of "a" (this may be known ahead of time), and then setting a reduced limit (e.g., the reduced limit to be used by the soft limiter) that is lower than the value of "intmax/a." The reduced limit may be a certain percentage of the maximum available limit of the soft limiter 103. For example, the limiting factor of the soft limiter 103 may be set to the reduced limit, where the reduced limit is equal to, for example, 90% or 95% of the value of "intmax/a."

In at least one embodiment, the operation of determining the value of "intmax/a" and setting the limiting factor of the soft limiter to a reduced limit may be performed by the controller 401 and/or controller 601, discussed in more detail below.

Further, in one implementation, the soft limiter (e.g., soft limiter 103) may be designed where the limiter threshold (e.g., the limit) is determined based on the gain parameter "a" (gain value "a"). For example, the limiter threshold may be set based on $\beta/a$ ($\beta$=intmax).

In some arrangements, the threshold of the soft limiter may be set slightly lower (e.g., a reduced limit) in order to provide some room for the soft limiter to occasionally exceed the threshold. For example, the reduced limit "b" may be selected such that $P(|L(Y,b)|>\beta/a)<p$, where Y is a random variable representing a mixed sample, where L is a function representing the output of the limiter, and where p is subjectively determined to give acceptably low clipping distortion. Some experimentation suggests that a value for p between 0.01% and 0.001% is a reasonable choice. Some experimentation suggests that a value of $b\approx 0.9 \ \beta/a$ is a reasonable choice.

In any of the embodiments described herein, a conventional soft limiter may be used in addition to or instead of the soft limiter (e.g., soft limiter 103) as described in this application.

The output of the soft limiter 103, the limited combined signal, is provided to an output multiplier (e.g., output multiplier 104). The output multiplier 104 of FIGS. 1 through 4 multiplies its received input signal (e.g., the limited combined signal) by a gain value. For example, the gain value applied to the output multiplier 104 may be a value of "a" (while applying the gain value of "1/a" to the input multipliers 101-1, 101-2, . . . 101-N), where "a" is a value greater than 1. The value of "a" that is used to apply the gain value to the input multipliers (e.g., input multipliers 101-1, 101-2, . . . 101-N) is the same factor of "a" that is used to apply the gain value to the output multiplier (e.g., output multiplier 104). However, the total gain value applied to the output multiplier is the inverse of the total gain value applied to the input multipliers, or vice versa (e.g., the total gain value applied to the input multipliers is the inverse of the total gain value applied to the output multiplier).

In other words, the total gain value of "1/a" is applied to the input multipliers (e.g., input multipliers 101-1, 101-2, . . . 101-N) while the total gain value of "a" is applied to the output multiplier (e.g., output multiplier 104). Therefore, when a (total) gain value is applied to each of the input multipliers (e.g., input multipliers 101-1, 101-2, . . . 101-N), the inverse of that (total) gain value is applied to the output multiplier (e.g., output multiplier 104). Likewise, when a (total) gain value is applied to the output multiplier (e.g., output multiplier 104), the inverse of that (total) gain value is applied to each of the input multipliers (e.g., input multipliers 101-1, 101-2, . . . 101-N).

As an example relating to the mixing system shown in FIGS. 1 through 4 (in a scenario where the number of input signals is equal to two and/or where the number of input multipliers is equal to two), a first input multiplier (e.g., input multiplier 101-1) multiplies a first input signal (e.g., input signal 1) by a first gain value ("1/a") to provide a first scaled signal while a second input multiplier (e.g., input multiplier 101-2) multiplies a second input signal (e.g., input signal 2) by the first gain value ("1/a") to provide a second scaled signal. Further, a combiner (e.g., combiner 102) combines the first scaled signal and the second scaled signal to provide a combined signal. A soft limiter (e.g., soft limiter 103) limits the combined signal by soft limiting the amplitudes of the combined signal to a certain level (may be a predetermined level) to provide a limited signal. An output multiplier (e.g., output multiplier 104) multiplies the limited signal by a second gain value ("a") to provide a mixed output signal, wherein the first gain value ("1/a") is a value that is equal to an inverse value of the second gain value ("a").

As another example relating to the mixing system shown in FIGS. 1 through 4 (in a scenario where the number of input signals is equal to three and/or where the number of input multipliers is equal to three), a first input multiplier (e.g., input multiplier 101-1) multiplies a first input signal (e.g., input signal 1) by a first gain value ("1/a") to provide a first scaled signal while a second input multiplier (e.g., input multiplier 101-2) multiplies a second input signal (e.g., input signal 2) by the first gain value ("1/a") to provide a second scaled signal and while a third input multiplier (e.g., input multiplier 101-N) multiplies a third input signal (e.g., input signal N) by the first gain value ("1/a") to provide a third mixed signal. Further, a combiner (e.g., combiner 102) combines the first scaled signal, the second scaled signal, and the third scaled signal to provide a combined signal. A soft limiter (e.g., soft limiter 103) limits the combined signal by soft limiting the amplitudes of the combined signal to a certain (predetermined) level to provide a limited signal. An output multiplier (e.g., output multiplier 104) multiplies the limited signal by a second gain value ("a") to provide a mixed output signal, wherein the first gain value ("1/a") is a value that is equal to an inverse value of the second gain value ("a").

In either of the two examples described above, when the gain factor of "a" is equal to 2, then the first gain value ("1/a") provided to the input multiplier 101-1, input multiplier 101-2, and input multiplier 101-N is a gain value equal to 0.5 (1/a=1/2) while the second gain value ("a") provided to the output multiplier 104 is a gain value equal to 2. Thus, the first gain value (1/2) is a value that is equal to an inverse value of the second gain value (2).

The gain factor applied to the input multiplier(s) (e.g., input multipliers 101-1, 101-2, ... 101-N) may be a predetermined value, e.g., a=2. The predetermined value may be preset (fixed), determined based on the number of input multipliers included in the input multiplying unit, and/or determined based on the number of input signals provided to the mixing system, depending on the particular embodiment.

For example, when the number of input multipliers included in the mixing system (e.g., input multiplying unit of the mixing system) or the number of input signals provided to the mixing system is equal to 2 or 3, the predetermined value (the gain factor of "a") may be preset and/or determined to be equal to 2. Therefore, in the mixing system, the value of "a" may be preset to (a=) 2 in order to balance the clipping protection and the loss of precision.

In addition, based on the proposed clipping/limiting protection method as described above, the gain parameter of "a" (the gain factor of "a") may be selected by balancing the probability of clipping/limiting in the mixing stage against the loss of precision from downscaling in fixed-point arithmetic. For example, for an audio sample drawn from signal $x_i$, represented as a random variable $X_i$, the probability of clipping/limiting during mixing can be expressed as:

$$P\left(\left|\sum_{i}^{n} X_i\right| > \beta\right) \quad (1)$$

where n is the number of input signals and $\beta$ is the maximum integer representation in the fixed width domain. It should be noted that the range of integer values is $[-\beta, \beta-1]$.

Further, the gain parameter of "a" is selected empirically such that:

$$P\left(\left|\frac{\sum_{i}^{n} X_i}{a}\right| > \beta\right) < p \quad (2)$$

where p is subjectively determined to give acceptably low clipping distortion. Some experimentation suggests that a value for p between 0.01% and 0.001% is a reasonable choice.

In aspects of the present invention, $\beta$ is set (preset) to $2^{15}$ due to the use of 16-bit integers for representing audio signals. It should be noted that, technically, the range of acceptable values for the audio samples is $[-2^{15}, 2^{15}-1]$.

In addition, when the number of input signals (n) is determined to be greater than 3, the mixing system may limit the value of n used in the above equation (s). For example, when it is determined that n is greater than 3, the mixing system may limit the value of n used in the above equation (s) to n=3. In other words, when it is determined that n is 4, the mixing system may limit the value of n used in the above equation (s) to n=3.

In addition, when the number of input signals (n) is determined to be less than 3, the mixing system may limit the value of n used in the above equation (s). For example, when it is determined that n is less than 3, the mixing system may limit the value of n used in the above equation (s) to n=3. In other words, when it is determined that n is 2, the mixing system may limit the value of n used in the above equation (s) to n=3.

Therefore, regardless of the number of incoming (input) signals according to at least some embodiments, more than 3 incoming (input) signals do not have to be mixed and the value of n in the above equation (s) may be set to n=3. Thus, under these conditions a gain parameter of a=2 satisfies equation (2) across a wide range of speech signals.

It should be noted that, in any of the example mixing systems shown in FIGS. 1 through 4, an output unit (not shown) may be found after the output multiplier 104. Similarly, in FIGS. 5 and 6, an output unit (not shown) may be found after the shifting unit 502. In at least one embodiment, the output unit receives the mixed signal outputted from the output multiplier 104 or the shifting unit 502 in order to relay, transmit, or transfer the mixed signal to another device (e.g., separate or connected), to another component of the mixing system, or to another component or device working in conjunction with the mixing system. The output unit is not limited to being a simple outputting device. For example, the output unit may be at least one antenna (e.g., a transmitter), at least one cable, or other similar such devices.

In FIGS. 2 through 6, component elements identical or equivalent to, those shown in FIG. 1 are designated by the same reference numerals. As such, detailed description thereof may be omitted.

Figure 2:
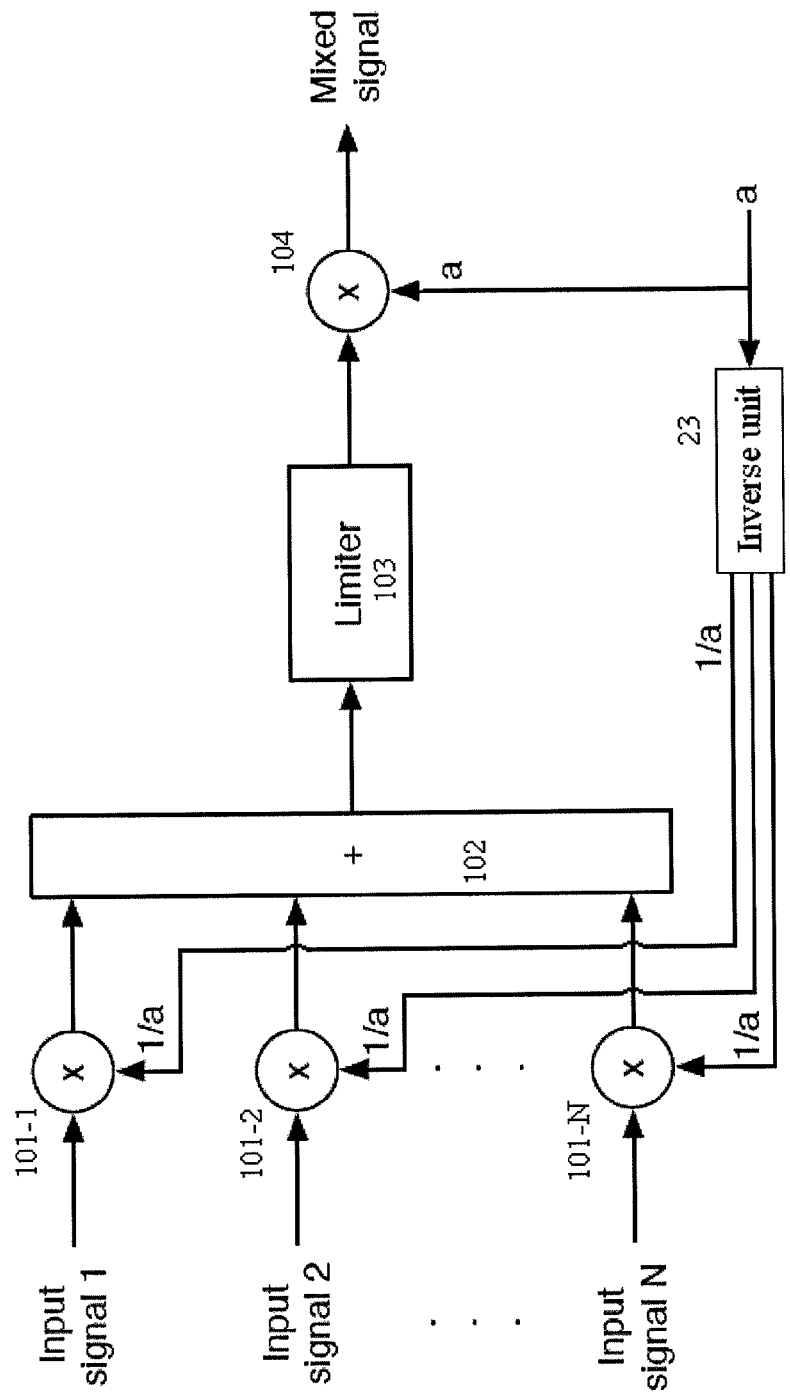
FIG. 2 is a circuit diagram of another aspect of a mixing system according to one or more embodiments described herein.

FIGS. 2 and 3 are circuit diagrams illustrating example mixing systems similar to the mixing system of FIG. 1. In addition to all of the aspects described herein with respect to FIG. 1, each of the mixing systems of FIGS. 2 and 3 also includes an inverse unit 23. The inverse units of FIGS. 2 and 3 receive an input (gain) value and perform an inversion operation on the received input (gain) value to produce an inverse (gain) value inverse to the received input (gain) value.

For example, in FIG. 2, the inverse unit 23 receives an input gain value, which corresponds to a gain value of "a." Here, the input gain value of a is equal to 2. Accordingly, inverse unit 23 provides an input gain value of 0.5 (1/a=1/2) to each of the input multipliers (e.g., input multipliers 101-1, 101-2, ... 101-N) while the mixing system provides the input gain value of 2 directly to the output multiplier 104.

Similarly in FIG. 3, the inverse unit 23 receives an input gain value, which corresponds to a gain value of "1/a." Here, the input gain value of 1/a is equal to 0.5 (1/a=1/2, where a=2). Thus, inverse unit 23 provides a gain value of 2 (a=2/1) to the output multiplier 104 while the mixing system provides the input gain value of 1/2 (1/a) directly to each of the input multipliers (e.g., input multipliers 101-1, 101-2, ... 101-N).

FIG. 4 is circuit diagram illustrating an example mixing system similar to the mixing system of FIGS. 1 through 3. In addition to all of the aspects described herein with respect to FIGS. 1 through 3, FIG. 4 also includes a controller (controller 401).

The controller (e.g., controller 401 and/or controller 601) controls one or more (e.g., up to all) of the components of the mixing system. The controller (e.g., controller 401 and/or controller 601) may also receive feedback and/or feed-forward signals from one or more of the components of the mixing system as illustrated in FIGS. 4 and 6.

The controller (e.g., controller 401 and/or controller 601) receives the input signals, e.g., input signals 1, 2, ... N, from the input unit(s); the scaled signals from the outputs of the input multipliers 101-1, 101-2, ... 101-N or the right shifted signals outputted from the shifting units 501-1, 501-2, ... 501-N; the combined signal from the output of the combiner 102; the limited signal from the output of the soft limiter 103, the mixed output signal from the output of the output multiplier 104 or the left shifted signal outputted from the shifting unit 502; and/or the outputted signal from the outputting unit, which are referred to as feed-forward information or feedback information. Based on the inputs (e.g., the input signals, the scaled signals or the (right) shifted signals, the combined signal, the limited signal, and/or the mixed output signal or the (left) shifted signal), the controller (e.g., controller 401) determines or calculates the gain factor of "a" and/or the setting of the limiting factor or the ceiling level in soft limiter 103 in order to ensure (with a high probability) that the mixed signal is not clipped and in order to allow for the levels of the original (received) signals to be maintained (e.g., for play out) after performing the entire mixing process is performed.

The controller (e.g., controller 401) may derive the gain value(s) (e.g., 1/a, a) that is to be applied to the input multipliers (e.g., input multiplier 101-1, input multiplier 101-2, ... input multiplier 101-N) and the output multiplier (e.g., output multiplier 104) based on the above equation (1) and/or (2). The controller may use additional information (e.g., feed-forward information and/or feedback information) that the system components send to the controller (with or without the consideration of equations (1) and/or (2)) to calculate or determine the gain factors which will be used to generate gain values(s) to be applied to the input multipliers (input multipliers 101-1, 101-2, ... 101-N) and the output multiplier (e.g., output multiplier 104).

For example, the controller may determine the number of input signals (e.g., input signal 1, input signal 2, ... input signal N) received by the mixing system (e.g., any of the example mixing systems shown in FIGS. 1 through 4). The controller can then determine or calculate a gain factor to be used to generate the gain value(s) to apply to the input multipliers and the output multiplier based on the number of input signals determined to have been received by the mixing system.

Further, the controller may determine the number of input signals (e.g., input signal 1, input signal 2, ... input signal N) provided to the plurality of input multipliers (e.g., input multipliers 101-1, 101-2, ... 101-N) and then, the controller can determine or calculate a gain factor to be used to generate gain value(s) to apply to the input multipliers (e.g., input multipliers 101-1, 101-2, ... 101-N) and the output multiplier (e.g., output multiplier 104) based on the number of input signals determined to be provided to the plurality of input multipliers.

Similarly, the controller may determine the number of input multipliers (input multipliers 101-1, 101-2, ... 101-N) needed or used in the mixing system (e.g., any of the example mixing systems shown in FIGS. 1 through 4), and then, the controller can determine or calculate a gain factor to be used to generate gain value(s) to apply to the input multipliers (e.g., input multipliers 101-1, 101-2, ... 101-N) and the output multiplier (e.g., output multiplier 104) based on the number of input multipliers determined to be needed or used in the mixing system.

However, in the above examples, the controller may also limit the number of input multipliers (e.g., input multipliers 101-1, 101-2, ... 101-N) to be used and/or the number of input signals (e.g., input signal 1, input signal 2, ... input signal N) to be used to 2, 3, 4, 5, etc.

In addition, the controller may select the gain parameter "a" (the gain factor of "a") by balancing the probability of clipping in the mixing stage against the loss of precision from downscaling in fixed-point arithmetic. For example, for an audio sample drawn from signal $x_i$, represented as a random variable $X_i$, the probability of clipping or limiting during mixing can be expressed as:

$$P\left(\left|\sum_{i}^{n} X_i\right| > \beta\right) \quad (1)$$

where n is the number of input signals and $\beta$ is the maximum integer representation in the fixed width domain. It should be noted that the range of integer values is $[-\beta, \beta-1]$.

Further, the gain parameter is selected empirically such that:

$$P\left(\left|\sum_{i}^{n} \frac{X_i}{a}\right| > \beta\right) < p \quad (2)$$

where p is subjectively determined to give acceptably low clipping/limiting distortion. Experimentation done by the inventors suggests that a value for p between 0.01% and 0.001% is a reasonable choice. In at least some embodiments, $\beta$ is set (preset) to $2^{15}$ due to the use of 16-bit integers for representing audio signals. It should be noted that, technically, the range of acceptable values for the audio samples is $[-2^{15}, 2^{15}-1]$.

As discussed above, the inverse units of FIGS. 2-3 receive an input gain value and perform an inversion operation on the received input gain value to produce an inverse gain value, which is inverse to the received input gain value. In the controller, the inverse unit 23 as shown and discussed in relation to FIGS. 2-3 may be found working in conjunction with the controller. More specifically, inverse unit 23 can be coupled to the controller or internal to the controller.

Figure 7:
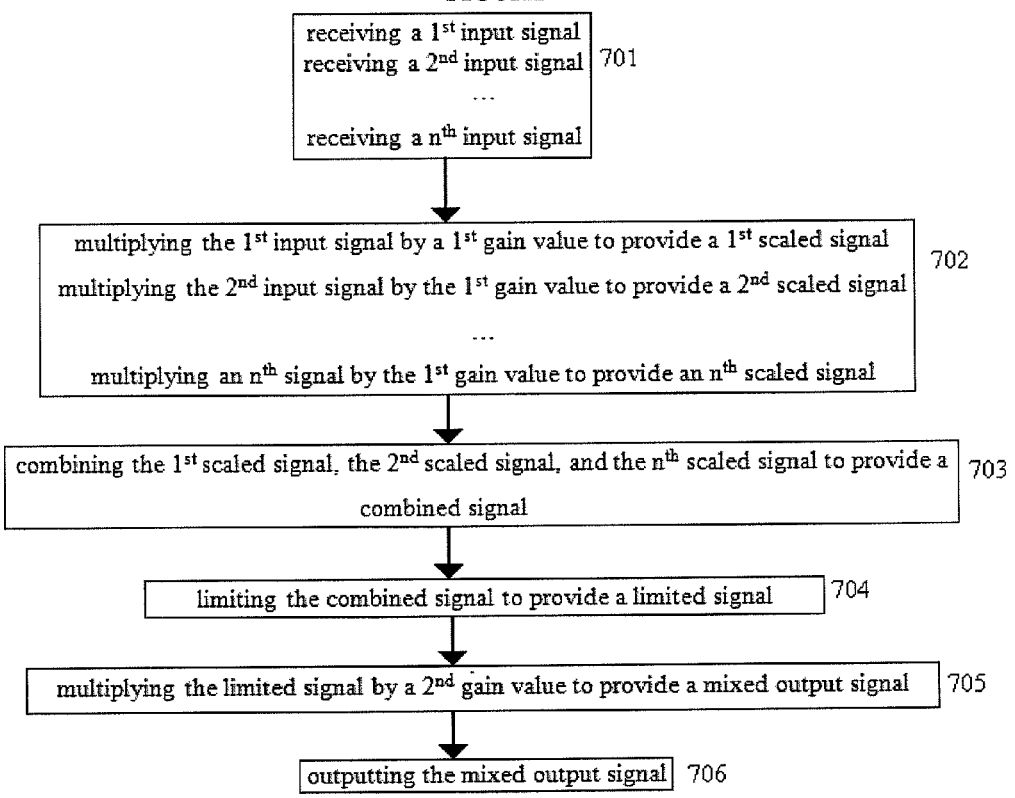
FIG. 7 is a flow chart representing one aspect of a mixing method according to one or more embodiments described herein.

FIG. 7 is the flow chart representing an example mixing method that may be performed by at least one of the mixing systems shown in FIGS. 1 through 4.

In step 701, the mixing method includes the step of receiving a plurality of (audio) input signals. For example, as illustrated in FIGS. 1 through 4, input signal 1 through input signal N are received. Step 701 is at least associated with the input unit(s) and/or the inputs signals provided to the input multipliers (e.g., input multipliers 101-1, 101-2, ... 101-N), and thus, details discussed in relation to FIGS. 1 through 4 are incorporated herewith.

In step 702, the plurality of input signals (e.g., N input signals) are each multiplied by a first gain value of "1/a" (derived by using a gain factor of "a") to provide a plurality of scaled signals (e.g., N scaled signals). Step 702 is at least associated with the input multipliers (e.g., input multipliers

101-1, 101-2, . . . 101-N), and thus, details discussed in relation to FIGS. 1 through 4 are incorporated herewith.

In step 703, the plurality of scaled signals are combined to provide a single combined signal. Step 703 is at least associated with the combiner (e.g., combiner 102), and thus, details discussed in relation to FIGS. 1 through 4 are incorporated herewith.

In step 704, the combined signal is soft limited to provide a limited signal. Step 704 is at least associated with the soft limiter (e.g., soft limiter 103), and thus, details discussed in relation to FIGS. 1 through 4 are incorporated herewith.

In step 705, the limited signal is multiplied by a second gain value of "a" (derived by using a gain factor of "a") to provide an output mixed signal. The gain factor of "a" used in Step 702 and 705 may be a preset value equal to 2. Accordingly, the first gain value (e.g., "1/a") is a value that is equal to an inverse value of the second gain value (e.g., "a"). Likewise, the second gain value (e.g., "a") is a value that is equal to an inverse value of the first gain value (e.g., "1/a"). Step 705 is at least associated with the output multiplier (e.g., output multiplier 104), and thus, details discussed in relation to FIGS. 1 through 4 are incorporated herewith.

In step 706, the output mixed signal is outputted. Step 706 is at least associated with the output unit, and thus, details discussed in relation to FIGS. 1 through 4 are incorporated herewith.

FIG. 5 is a circuit diagram for a mixing system similar to the mixing system of FIGS. 1 through 4. In addition to all of the aspects as discussed in regard to FIGS. 1 through 4, FIG. 5 replaces the input multipliers (e.g., input multipliers 101-1, 101-2, . . . 101-N) of FIGS. 1 through 4 with right shifting units (e.g., right shifting unit 501-1, right shifting unit 501-2, . . . right shifting unit 501-N) and replaces the output multiplier (e.g., output multiplier 104) of FIGS. 1 through 4 with a left shifting unit (e.g., left shifting unit 502).

The right shifting units (e.g., right shifting unit 501-1, right shifting unit 501-2, . . . right shifting unit 501-N) of FIG. 5, each perform a right shifting operation on the inputted signals (e.g., input signal 1, input signal 2, . . . input signal N) to provide a (right) shifted signal. The right shift should be performed by a value greater than or equal to 1.

By using the right shifting units (e.g., right shifting unit 501-1, right shifting unit 501-2, . . . right shifting unit 501-N), the requirement for providing a divided gain value (e.g., "1/a") to the input multipliers (e.g., input multipliers 101-1, 101-2, . . . 101-N) is eliminated. Therefore, right shifting is performed to scale (divide) the digital input signal down so that the most significant bits remain unaffected.

Thus, by using the right shifting units (e.g., right shifting unit 501-1, right shifting unit 501-2, . . . right shifting unit 501-N) the use of gain providing units and input multipliers (e.g., input multipliers 101-1, 101-2, . . . 101-N) are eliminated.

Once the shifted signals are generated (e.g., the right shifting unit 501-1 providing a first right shifted signal, the right shifting unit 501-2 providing a second right shifted signal, . . . the right shifting unit 501-N providing a $N^{th}$ right shifted signal), the shifted signals are provided to the combiner (e.g., combiner 102).

The combiner 102 performs a combining operation on the inputted (shifted) signals (the first right shifted signal, the second right shifted signal, . . . the $N^{th}$ right shifted signal) to provide a combined signal. (The details regarding the functionality of combiner 102 have already been discussed above in relation to FIGS. 1 through 4, therefore the functionality of combiner 102 is incorporated herewith.) Once the combiner 102 generates the combined signal, the combiner provides the combined signal to a soft limiter (soft limiter 103).

Soft limiter 103 performs a soft limiting operation on the combined signal provided by the combiner 102 in order to provide a limited signal. (The details regarding the functionality of soft limiter 103 have already been discussed above in relation to FIGS. 1 through 4, therefore the functionality of soft limiter 103 is incorporated herewith.) Once the soft limiter 103 generates the limited signal, the soft limiter provides the limited signal to a left shifting unit (left shifting unit 502).

The left shifting unit (e.g., left shifting unit 502) of FIG. 5, perform a left shifting operation on the limited signal to provide a (left) shifted signal. The left shift should be performed by a value greater than or equal to 1.

By using left shifting unit (e.g., left shifting unit 502), the use of an output multiplier (e.g., output multiplier 104) and a gain providing unit to restore the combined/limited signal back to its original received signal level is eliminated.

However, it should be noted that FIGS. 1 through 4 can be altered with either right shifting units or the left shifting unit. More specifically, FIGS. 1 through 4 may be altered with replacing the input multipliers (e.g., input multipliers 101-1, 101-2, . . . 101-N) of FIGS. 1 through 4 with right shifting units (e.g., right shifting unit 501-1, right shifting unit 501-2, . . . right shifting unit 501-N) while maintaining the output multiplier (e.g., output multiplier 104) of FIGS. 1 through 4. Likewise, FIGS. 1 through 4 may be altered with replacing the output multiplier (e.g., output multiplier 104) of FIGS. 1 through 4 with a left shifting unit (e.g., left shifting unit 502) while maintaining the input multipliers (e.g., input multipliers 101-1, 101-2, . . . 101-N).

FIG. 6 is a circuit diagram for a mixing system similar to the mixing system of FIG. 5. In addition to all of the aspects as discussed in regard to FIG. 5, FIG. 6 also includes a controller (e.g., controller 601).

The controller of FIG. 6 (e.g., controller 601) includes the functionality of the controller of FIG. 4 (e.g., controller 401) in addition to following added functionality. More specifically, in addition to the functionality of the controller of FIG. 4 (e.g., controller 401), the controller of FIG. 6 (e.g., controller 601) controls the right shifting units (e.g., right shifting unit 501-1, right shifting unit 501-2, . . . right shifting unit 501-N) and the left shifting unit (e.g., left shifting unit 502).

In addition, the controller (e.g., controller 601) receives the input signals, e.g., input signals 1, 2, . . . N, from the input unit(s); right shifted signals from the shifting units 501-1, 501-2, . . . 501-N; the combined signal from the output of the combiner 102; the limited signal from the output of the soft limiter 103, the left shifted signals from the output of the shifting unit 502; and the outputted signal from the outputting unit, which are referred to as feed-forward information or feedback information. Based on the inputs (e.g., the input signals, the right shifted signals, the combined signal, the limited signal, and/or the (left) shifted signal), the controller (e.g., controller 601) determines or calculates the amount of shifting to be performed in the shifting units (e.g., shifting units 501-1, 501-2, . . . 501-N and shifting unit 502) and/or the setting of the limiting factor or the ceiling level in soft limiter 103 in order to ensure (with a high probability) that the mixed signal is not clipped and in order to allow for the levels of the original (received) signals to be maintained (e.g., for play out) after performing the entire mixing process is performed.

The controller (e.g., controller 601) may determine or calculate the amount of shifting to be performed in the shifting units (e.g., shifting units 501-1, 501-2, . . . 501-N and shifting unit 502) based on the above equation (1) and/or (2). The controller may use additional information (e.g., feed-forward information and/or feedback information) that the system components send to the controller (with or without the consideration of equations (1) and/or (2)) to calculate or determine the amount of shifting to be performed in the shifting units (e.g., shifting units 501-1, 501-2, . . . 501-N and shifting unit 502).

For example, the controller may determine the number of input signals (e.g., input signal 1, input signal 2, . . . input signal N) received by the mixing system (e.g., FIGS. 1 through 4) and then, the controller can determine or calculate amount of shifting to be performed in the shifting units (e.g., shifting units 501-1, 501-2, . . . 501-N and shifting unit 502) based on the number of input signals determined to have been received by the mixing system.

Further, the controller may determine the number of input signals (e.g., input signal 1, input signal 2, . . . input signal N) provided to the plurality of (right) shifting units (e.g., shifting units 501-1, 501-2, . . . 501-N) and then, the controller can determine or calculate amount of shifting to be performed in the shifting units (e.g., shifting units 501-1, 501-2, . . . 501-N and shifting unit 502) based on the number of input signals determined to be provided to the plurality of (right) shifting units.

Similarly, the controller may determine the number of (right) shifting units (e.g., shifting units 501-1, 501-2, . . . 501-N) needed or used in the mixing system, and then, the controller can determine or calculate amount of shifting to be performed in the shifting units (e.g., shifting units 501-1, 501-2, . . . 501-N and shifting unit 502) based on the number of (right) shifting units determined to be needed or used in the mixing system.

However, in the above examples, the controller may also limit the number of (right) shifting units (e.g., shifting units 501-1, 501-2, . . . 501-N) to be used and/or the number of input signals (e.g., input signal 1, input signal 2, . . . input signal N) to be used to 2, 3, 4, 5, etc.

In addition, the controller may select the amount of shifting to be performed in the shifting units (e.g., shifting units 501-1, 501-2, . . . 501-N and shifting unit 502) by balancing the probability of clipping in the mixing stage against the loss of precision from downscaling in fixed-point arithmetic. For example, for an audio sample drawn from signal $x_i$, represented as a random variable the probability of clipping or limiting during mixing can be expressed as:

$$P\left(\left|\sum_{i}^{n} X_i\right| > \beta\right) \quad (1)$$

where n is the number of input signals and $\beta$ is the maximum integer representation in the fixed width domain. It should be noted that the range of integer values is $[-\beta, \beta-1]$.

Further, the gain parameter is selected empirically such that:

$$P\left(\left|\sum_{i}^{n} \frac{X_i}{a}\right| > \beta\right) < p \quad (2)$$

where p is subjectively determined to give acceptably low clipping/limiting distortion. Experimentation done by the inventors suggests that a value for p between 0.01% and 0.001% is a reasonable choice. $\beta$ is set (preset) to $2^{15}$ due to the use of 16-bit integers for representing audio signals. It should be noted that, technically, the range of acceptable values for the audio samples is $[-2^{15}, 2^{15}-1]$.

Figure 8:
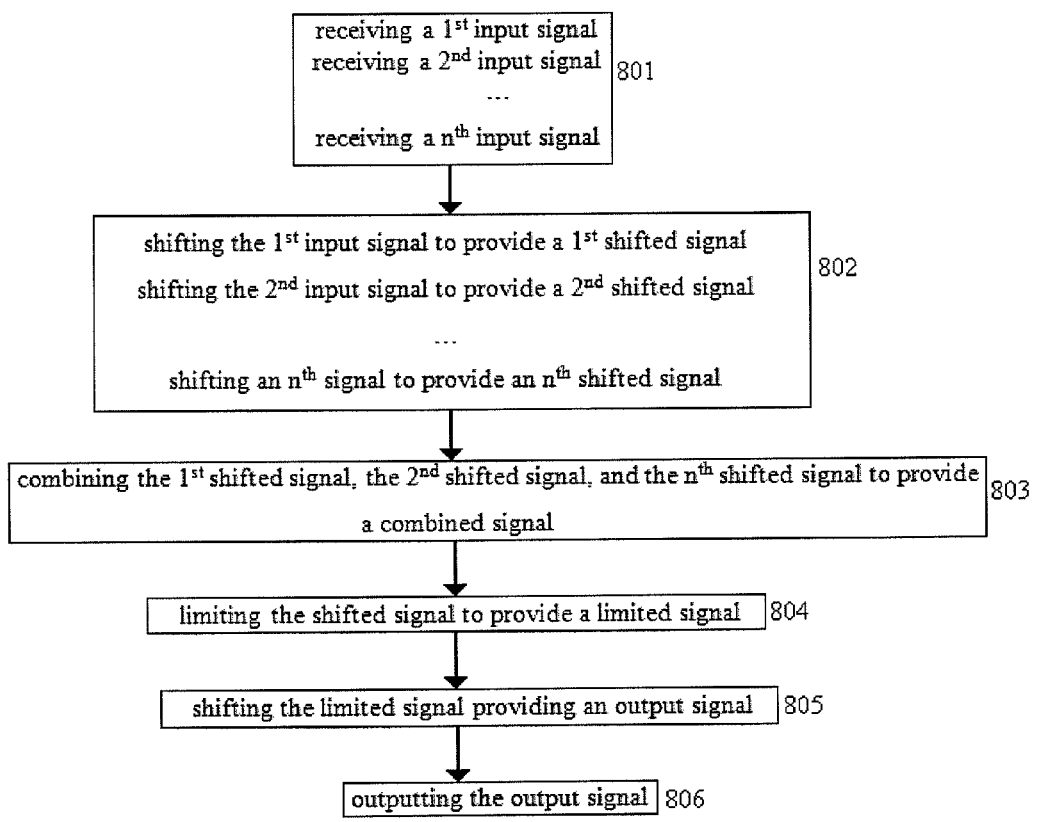
FIG. 8 is a flow chart representing one aspect of a mixing method according to one or more embodiments described herein.

FIG. 8 is the flow chart representing the mixing method for at least FIGS. 5 through 6.

In step 801, the mixing method includes the step of receiving a plurality of (audio) input signals. For example, as illustrated in FIGS. 1 through 6, input signal 1 through input signal N are received. Step 801 is at least associated with the input unit(s) and/or the inputs of the (right) shifting units (e.g., shifting units 501-1, 501-2, . . . 501-N), and thus, details discussed in relation to FIGS. 1 through 6 are incorporated herewith.

In step 802, the plurality of input signals (e.g., N input signals) are each right shifted to provide right shifted signals. Step 802 is at least associated with the (right) shifting units (e.g., shifting units 501-1, 501-2, . . . 501-N), and thus, details discussed in relation to FIGS. 5 through 6 are incorporated herewith.

In step 803, the plurality of right shifted signals are combined to provide a single combined signal. Step 804 is at least associated with the combiner (e.g., combiner 102), and thus, details discussed in relation to FIGS. 1 through 6 are incorporated herewith.

In step 804, the combined signal is soft limited to provide a limited signal. Step 804 is at least associated with the soft limiter (e.g., soft limiter 103), and thus, details discussed in relation to FIGS. 1 through 6 are incorporated herewith.

In step 805, the limited signal is left shifted to provide a mixed output signal. Step 805 is at least associated with the (left) shifting unit (e.g., shifting unit 502), and thus, details discussed in relation to FIGS. 5 through 6 are incorporated herewith.

The mixing systems as illustrated in FIGS. 1 through 6 can be designed to receive all signal(s), process all signal(s), and output all signal(s) (e.g., signals received by the mixing system; the signals received by, processed in, and outputted by the input multipliers; the signals received by, processed in, and outputted by the right shifting units; the signals received by, processed in, and outputted by the combiner; the signals received by, processed in, and outputted by the soft limiter; the signals received by, processed in, and outputted by the output multiplier; and the signals received by, processed in, and outputted by the left shifting unit) in the same type and at the same resolution of that of the received input signals which are received and/or outputted by the mixing system.

In other words, FIGS. 1 through 6 can be designed to perform all processing, in all of the disclosed components, with the same fixed width (length) data type. For example, the signals which may be inputted to, processed by, and outputted by inputting unit(s) or inputted to, processed by, and outputted by the mixing system, the signals inputted to, processed by, and outputted by the input multipliers, the signals inputted to, processed by, and outputted by the right shifting units, the signal(s) inputted to, processed by, and outputted by the combiner, the signal inputted to, processed by, and outputted by the soft limiter, the signal inputted to, processed by, and outputted by the output multiplier, the signal inputted to, processed by, and outputted by the left shifting unit, and the signal inputted to, processed by, and outputted by the output unit may all be inputted to, processed by, and outputted by its relative component in the same fixed width (length). In other words, the input to, the processing of, and the outputting of each and every signal of the mixing system may be the same fixed width data type (e.g., 16 bit integers).

For example, the input multipliers can receive signals and perform multiplication with a gain factor to provide scaled signals, all at a fixed width data type of x bit integers (e.g., x=16), or the right shifting units can receive signals and perform right shifting to provide right shifted signals, all at the fixed width data type of x bit integers. The outputted signals (e.g., the scaled signals or the right shifted signals) are then outputted, received by the combiner, and processed by the combiner, all at the fixed width data type of x bit integers. The outputted signal (e.g., the combined signal) is then outputted by the combiner, received by the soft limiter, and processed by the soft limiter, all at the fixed width data type of x bit integers. The outputted signal (e.g., the limited signal) is then outputted, received by the output multiplier to provide a mixed output signal or by the left shifting unit to provide a mixed output signal, and processed by the output multiplier or by the left shifting unit, all at the fixed width data type of x bit integers. Finally, the mixed output signal is outputted at the fixed width data type of x bit integers.

Figure 9:
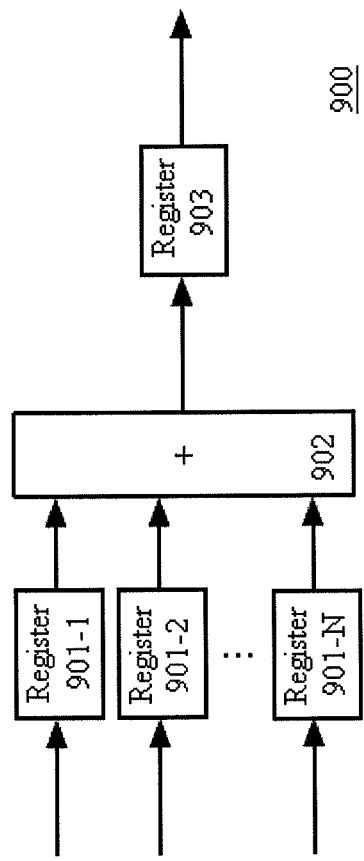
FIG. 9 is a circuit diagram of one aspect of the combiner according to one or more embodiments described herein.

FIG. 9 is a circuit diagram of one aspect of a combiner according to the present invention. While the combiner (e.g., combiner 102) of FIGS. 1 through 6 can be a conventional combiner or a combiner as discussed above in reference to FIGS. 1 through 6, combiner 900 may be substituted for the combiner 102 of FIGS. 1 through 6.

Combiner 900 of FIG. 9 includes input registers (e.g., input registers 901-1, 901-2, ... 901-N), a combining unit 902, and an output register (e.g., output register 903). (The output register (e.g., output register 903) is optional, as will be discussed in detail below.)

Normally, as illustrated in FIGS. 1 through 6, the inputted signals (the scaled signals or the right shifted signals) received by combiner 102 is processed at a fixed width of x bit which corresponds to the fixed width (length) of the signals received and outputted (or mixed) by the mixing system. Similarly, in FIG. 9, a fixed width (length) of x bits (e.g., 16 bit integers) can be received by the combiner which correspond to the fixed width (length) of the signals received and outputted (or mixed) by the mixing system. In addition, combiner 102 combines the inputted signals at the fixed width (length) of x bits (e.g., 16 bit integers) and outputs a combined signal at the fixed width (length) of x bits (e.g., 16 bit integers).

In contrast, in FIG. 9, the combiner 900 receives the inputted signals (the scaled signals or the right shifted signals) at the input registers (e.g., registers 901-1, 901-2, ... 901-N), where the input registers can (temporarily) store the inputted signals at a fixed width (length) greater than x bits (32 bit integers, 64 bit integers, 128 bit integers, etc.), and where the mixing system and combiner 900 receives signals at the fixed width (length) of x bits (e.g., 16 bit integers). Further, combining unit 902 combines the signals outputted by the input registers (e.g., registers 901-1, 901-2, ... 901-N) at the fixed width (length) greater than x bits or at the fixed width (length) of y bits, where the value of y is greater than the value of x.

After combining at the fixed width (length) greater than x bits (32 bit integers, 64 bit integers, 128 bit integers, etc.), the combiner may output a combined signal at the fixed width (length) greater than x bits where the output register 803 receives the combined signal at the fixed width (length) greater than x bits and where the output register 803 outputs a signal at the fixed width (length) of x bits (16 bit integers).

Alternatively, after combining at the fixed width (length) greater than x bits (32 bit integers, 64 bit integers, 128 bit integers, etc.), the combiner may output a combined signal at the fixed width (length) of x bits (16 bit integers) which eliminates the need for the output register 803.

In addition, the soft limiter (of FIGS. 1 through 6) can be designed to perform the "soft limiting" processing at the increase fixed width (length). More specifically, soft limiter 103 can perform the "soft limiting" processing at the fixed width (length) greater than x bits (32 bit integers, 64 bit integers, 128 bit integers, etc.). However, if a soft limiter (of FIGS. 1 through 6) performing the "soft limiting" processing at a fixed width (length) greater than x bits (32 bit integers, 64 bit integers, 128 bit integers, etc.) is used, the mixing system as discussed above, the use of the input multipliers 101-1, 101-2, ... 101-N, the output multiplier 104, the gain providing unit(s), the (right) shifting units 501-1, 501-2, ... 501-N, and the (left) shifting unit 502 are all eliminated (and would all be removed from the system of FIGS. 1 through 6).

For example, when the soft limiter 103 receives the combined signal at the fixed width (length) of x bits (16 bit integers), the soft limiter 103 performs the "soft limiting" processing/operation at the fixed width (length) greater than x bits (32 bit integers, 64 bit integers, 128 bit integers, etc.). After the soft limiter 103 performs the "soft limiting" processing/operation at the fixed width greater than x bits, the soft limiter 103 outputs the limited signal at the fixed width (length) of x bits (16 bit integers).

Alternatively, when the soft limiter 103 receives the combined signal at the fixed width (length) greater than x bits (32 bit integers, 64 bit integers, 128 bit integers, etc.), the soft limiter 103 performs the "soft limiting" processing/operation at the fixed width (length) greater than x bits. After the soft limiter 103 performs the "soft limiting" processing/operation at the fixed width greater than x bits, the soft limiter 103 outputs the limited signal at the fixed width (length) of x bits (16 bit integers).

Therefore, while the mixing system (FIGS. 1 through 6) can perform all of the (mixing) operations at a fixed length of x bit integers (e.g., 16 bit integers), the soft limiter and/or the combiner (of FIGS. 1 through 6 and 9) can perform their associated operations at either the fixed length of x bit integers (16 bit integers) or at a fixed length greater than the x bit integers (32 bit integers, 64 bit integers, 128 bit integers, etc.).

Thus, by operating the components of the mixing system at a fixed length of x bit integers while operating the combiner and/or the soft limiter at a fixed length greater than the x bit integers, the signal may be reduced/soft limited so that no (or minimal) clipping occurs when the signal is converted back to the 16 bit domain.

It should be note that the adjustable bit widths in the soft limiter and/or the combiner (of FIGS. 1 through 6 and FIG. 9) can be selected by the controller (e.g., controller 401 and/or controller 601). For example, the controller can determine to change the fixed length processing of the soft limiter (e.g., soft limiter 103) and/or the combiner (e.g., combiner 102 or combiner 900) from x bit integers (16 bit integers) to a fixed length greater than the x bit integers (e.g., 32 bit integers, 64 bit integers, 128 bit integers, etc.).

For example, the controller can determine to change the fixed length processing of the soft limiter (e.g., soft limiter 103) and/or the combiner (e.g., combiner 102 or combiner 900) from x bit integers to a fixed length greater than the x bit integers based on the information (feed-forward and/or feedback information) that the system components send to the controller (with or without the consideration of equations (1) and/or (2)) to calculate or determine the gain value(s) to apply to the input multipliers (e.g., input multipliers 101-1, 101-2, ... 101-N) or to calculate or determine the amount of shifting to be performed in the shifting units (e.g., shifting units 501-1, 501-2, ... 501-N) and to calculate or determine the gain value to apply to the output multiplier (e.g., output multiplier 104 or the output of the shifting unit 502) or to calculate or determine the amount of shifting to be performed in the shifting units (e.g., shifting units 501-1, 501-2, ... 501-N and shifting unit 502).

Figure 10:
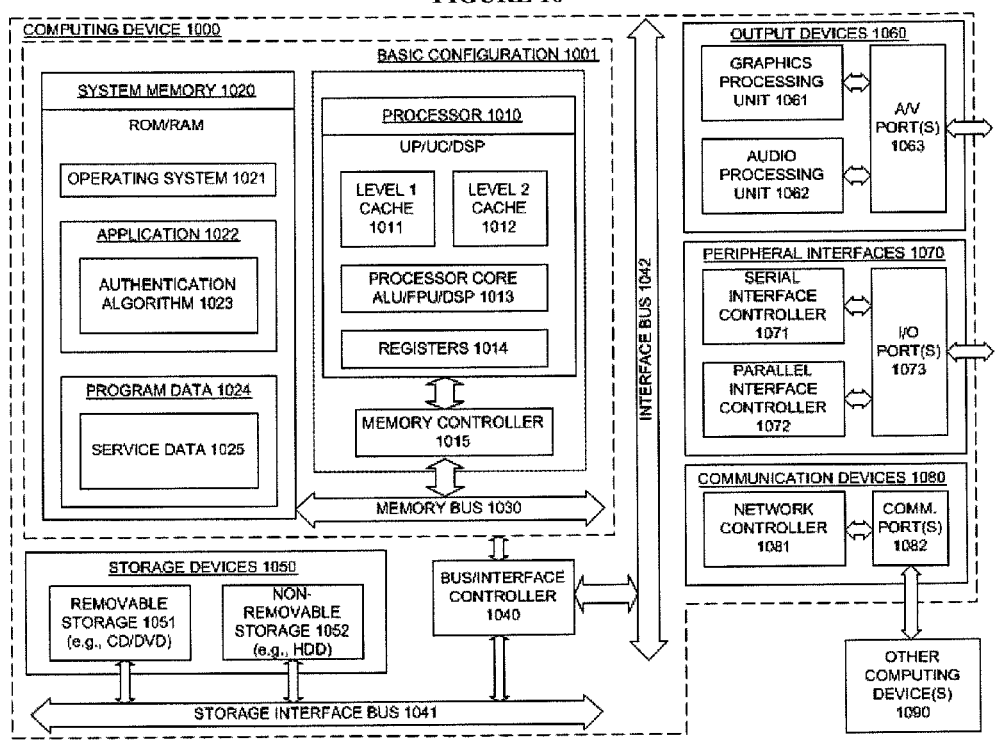
FIG. 10 is a circuit diagram of one aspect of the controller according to one or more embodiments described herein.

FIG. 10 is a circuit diagram of one aspect of the controller (also referred to as computing device 1000) according to an embodiment of the invention. More specially, the controller as disclosed in FIG. 10 can be used as the controller of FIGS. 4 and 6 (e.g., controller 401 and/or controller 601).

In a very basic configuration of computing device 1000 (e.g., controller 401 and/or controller 601), the computing device 1000 typically includes one or more processors 1010 and a system memory 1020. A memory bus 1030 can be used for communications between the processor 1010 and the system memory 1020.

Depending on the desired configuration, the one or more processor 1010 of computing device 1000 can be of any type including but not limited to a microprocessor, a microcontroller, a digital signal processor, or any combination thereof. Processor 1010 can include one more levels of caching, such as a level one cache 1011 and a level two cache 1012, a processor core 1013, and registers 1014. The processor core 1013 can include an arithmetic logic unit (ALU), a floating point unit (FPU), a digital signal processing core (DSP Core), or any combination thereof. A memory controller 1015 can also be used with the processor 1010, or in some implementations the memory controller 1015 can be an internal part of the processor 1010.

Depending on the desired configuration, the system memory 1020 can be of any type including but not limited to volatile memory (such as RAM), non-volatile memory (such as ROM, flash memory, etc.) or any combination thereof. System memory 1020 typically includes an operating system 1021, one or more applications 1022, and program data 1024. Application 1022 includes an authentication algorithm 1023. Program Data 1024 includes service data 1025.

Computing device 1000 can have additional features or functionality, and additional interfaces to facilitate communications between the basic configuration 1001 and any required devices and interfaces. For example, a bus/interface controller 1040 can be used to facilitate communications between the basic configuration 1001 and one or more data storage devices 1050 via a storage interface bus 1041. The data storage devices 1050 can be removable storage devices 1051, non-removable storage devices 1052, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data System memory 1020, removable storage 1051 and non-removable storage 1052 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by the computing device 1000. Any such computer storage media can be part of the computing device 1000.

Computing device 1000 can also include an interface bus 1042 for facilitating communication from various interface devices (e.g., output interfaces, peripheral interfaces, communication interfaces, etc.) to the basic configuration 1001 via the bus/interface controller 840. Example output devices 1060 include a graphics processing unit 1061 and an audio processing unit 1062, which can be configured to communicate to various external devices such as a display or speakers via one or more A/V ports 1063. Example peripheral interfaces 1070 include a serial interface controller 1071 or a parallel interface controller 1072, which can be configured to communicate with external devices such as input devices (e.g., keyboard, mouse, pen, voice input device, touch input device, etc.) or other peripheral devices (e.g., printer, scanner, etc.) via one or more I/O ports 1073. An example communication device 1080 includes a network controller 1081, which can be arranged to facilitate communications with one or more other computing devices 1090 over a network communication via one or more communication ports 1082. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 1000 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1000 can also be implemented as a personal computer including both laptop computer and non-laptop computer configurations.

There is little distinction left between hardware and software implementations of aspects of systems; the use of hardware or software is generally (but not always, in that in certain contexts the choice between hardware and software can become significant) a design choice representing cost versus efficiency tradeoffs. There are various vehicles by which processes and/or systems and/or other technologies described herein can be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation. In one or more other scenarios, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof.

In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Exemplary embodiments are shown and described in the present disclosure. It is to be understood that the embodiments are capable of use in various other combinations and environments and are capable of changes or modifications within the scope of the inventive concept as expressed herein. Some such variations may include using programs stored on non-transitory computer-readable media to enable computers and/or computer systems to carry our part or all of the method variations discussed above. Such variations are not to be regarded as departure from the spirit and scope of the invention, and all such modifications as would be obvious to one skilled in the art are intended to be included within the scope of the following claims:

We claim:

1. An apparatus comprising:
    a first input multiplier multiplying a first digital input signal by a first gain value to provide a first scaled signal;
    a second input multiplier multiplying a second digital input signal by the first gain value to provide a second scaled signal;
    a combiner combining the first scaled signal and the second scaled signal to provide a combined signal;
    a soft limiter soft limiting the combined signal by reducing some of the amplitudes of the combined signal to provide a soft limited signal; and
    an output multiplier multiplying the soft limited signal by a second gain value to provide a mixed output signal,
    wherein the first gain value is a value that is equal to an inverse value of the second gain value.

2. The apparatus according to claim 1,
    wherein the first digital input signal is of a fixed width data type having a fixed length of x bit integers,
    wherein the second digital input signal is of the fixed width data type having the fixed length of x bit integers,
    wherein the mixed output signal is of the fixed width data type having the fixed length of x bit integers,
    wherein the combiner is combining the first scaled signal and the second scaled signal at a fixed length of y bit integers,
    wherein the soft limiter is soft limiting the combined signal at the fixed length of x bit integers, and
    wherein the value of y is greater than the value of x.

3. The apparatus according to claim 1, wherein the first gain value or the second gain value is determined based on a probability of clipping in the apparatus.

4. The apparatus according to claim 2, wherein the first gain value or the second gain value is determined based on a probability of clipping in the apparatus.

5. The apparatus according to claim 1, wherein the apparatus is a mixing system.

6. The apparatus according to claim 1, further comprising:
    an input multiplier unit comprising a plurality of input multipliers, the plurality of input multipliers including at least the first input multiplier and the second input multiplier; and
    a controller determining the number of input signals provided to the plurality of input multipliers,
    wherein the controller determines the first gain value or the second gain value based on the number of input signals provided to the plurality of input multipliers.

7. The apparatus according to claim 1, further comprising:
    a third input multiplier multiplying a third digital input signal by the first gain value to provide a third scaled signal,
    wherein the combiner combines the first scaled signal, the second scaled signal, and the third scaled signal to generate the combined signal.

8. The apparatus according to claim 1,
    wherein the soft limiter reduces some of the amplitudes of the combined signal based on a comparison to a threshold,
    wherein the threshold is determined based on either the first gain value or the second gain value.

9. The apparatus according to claim 8,
    wherein the soft limiter reduces some of the amplitudes of the combined signal based on a comparison to a threshold, wherein the threshold is determined based on a probability of clipping in the mixing system and either the first gain value or the second gain value.

10. The apparatus according to claim 1, wherein the second gain value is equal to 2.

11. The apparatus according to claim 1, wherein the combiner is an adder that adds the first scaled signal and the second scaled signal to provide the combined signal.

12. The apparatus according to claim 1, further comprising:
an output unit outputting the mixed output signal,
wherein the output unit is an antenna or a cable.

13. A mixing system comprising:
a plurality of input multipliers respectively multiplying a plurality of digital input signals by a first gain value to respectively provide a plurality of scaled signals;
a combiner combining the plurality of scaled signals to provide a combined signal;
a soft limiter soft limiting the combined signal by reducing some of the amplitudes of the combined signal to provide a soft limited signal; and
an output multiplier multiplying the soft limited signal by a second gain value to provide a mixed output signal,
wherein the first gain value is a value that is equal to an inverse value of the second gain value.

14. A mixing system according to claim 13, wherein the first gain value or the second gain value is determined based on the number of said plurality of digital input signals multiplied by the first gain value.

15. A mixing system according to claim 13, wherein the first gain value or the second gain value is determined based on a probability of clipping in the mixing system.

16. A mixing system according to claim 13, wherein the first gain value or the second gain value is determined based on the number of said plurality of digital input signals multiplied by the first gain value and a probability of clipping in the mixing system.

17. A method comprising:
multiplying a first digital input signal by a first gain value to provide a first scaled signal;
multiplying a second digital input signal by the first gain value to provide a second scaled signal;
combining the first scaled signal and the second scaled signal to provide a combined signal;
soft limiting the combined signal by reducing some of the amplitudes of the combined signal to provide a soft limited signal; and
multiplying the soft limited signal by a second gain value to provide a mixed output signal,
wherein the first gain value is a value that is equal to an inverse value of the second gain value.

18. A non-transitory computer readable medium having instructions stored thereon, such that when the instructions are read and executed by one or more processors, said one or more processors is configured to perform the steps of:
multiplying a first digital input signal by a first gain value to provide a first scaled signal;
multiplying a second digital input signal by the first gain value to provide a second scaled signal;
combining the first scaled signal and the second scaled signal to provide a combined signal;
soft limiting the combined signal by reducing some of the amplitudes of the combined signal to provide a soft limited signal; and
multiplying the soft limited signal by a second gain value to provide a mixed output signal,
wherein the first gain value is a value that is equal to an inverse value of the second gain value.

\* \* \* \* \*